(12) United States Patent
Ryan, Jr.

(10) Patent No.: US 6,783,258 B2
(45) Date of Patent: Aug. 31, 2004

(54) ILLUMINATED MESSAGE SIGN WITH ANGLED LIGHT EMITTING DEVICE ARRAY

(75) Inventor: Patrick Henry Ryan, Jr., Atlanta, GA (US)

(73) Assignee: American Signal Company, Atlanta, GA (US)

( * ) Notice: Subject to any disclaimer, the term of this patent is extended or adjusted under 35 U.S.C. 154(b) by 0 days.

(21) Appl. No.: 10/188,911

(22) Filed: Jul. 2, 2002

(65) Prior Publication Data

US 2004/0004844 A1 Jan. 8, 2004

(51) Int. Cl.[7] .............................................. F21V 19/00
(52) U.S. Cl. ..................... 362/249; 362/238; 362/382; 362/800
(58) Field of Search ................................. 362/238, 245, 362/249–252, 545, 800, 227, 382; 257/99

(56) References Cited

U.S. PATENT DOCUMENTS

| | | | |
|---|---|---|---|
| 3,530,615 A | | 9/1970 | Meyer |
| 4,639,724 A | | 1/1987 | Togneri |
| 4,654,629 A | * | 3/1987 | Bezos et al. ................... 257/99 |
| 4,803,599 A | * | 2/1989 | Trine et al. .................. 362/249 |
| 5,128,787 A | | 7/1992 | Blonder |
| 5,418,697 A | * | 5/1995 | Chiou ........................ 362/545 |
| 5,469,347 A | * | 11/1995 | Duve et al. .................. 362/245 |
| 5,523,929 A | | 6/1996 | Ogihara |
| 5,750,974 A | * | 5/1998 | Sasaki et al. ............... 362/249 |
| 5,973,607 A | | 10/1999 | Munyon |
| 6,147,623 A | | 11/2000 | Rippen |

* cited by examiner

Primary Examiner—Alan Cariaso
(74) Attorney, Agent, or Firm—Jason A. Bernstein; Powell, Goldstein, Frazer & Murphy LLP

(57) ABSTRACT

A portable message sign having a housing and a front surface angled with respect to a rear surface and an array of light emitting devices (such as LEDs) being angled so that the LEDs are parallel to the horizon. The LEDs are mounted at an angle to a printed circuit board (PCB), which is mounted between the front and rear surfaces. In one embodiment, the pins of the LEDs are of different lengths so that when mounted to the PCB the lens of the LED directs light at an angle with respect to the PCB. In another embodiment, a strip of hard material is laid down next to the holes in the PCB that through mount LEDs are inserted, which cause the LED to mount at an angle.

5 Claims, 4 Drawing Sheets

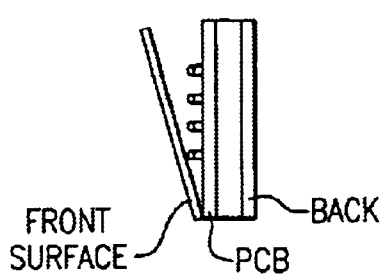
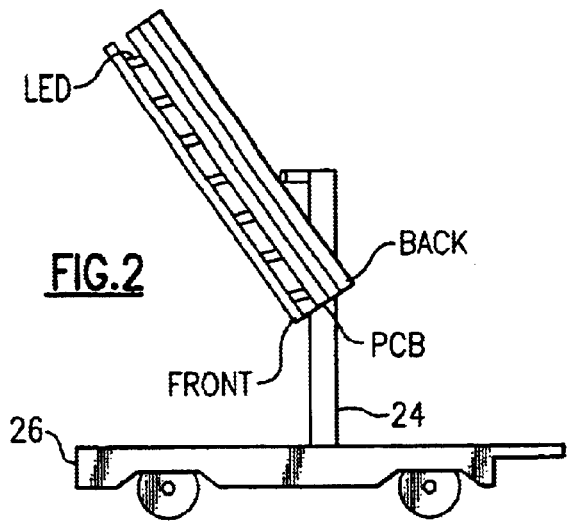
FIG.1 Prior Art
FIG.2
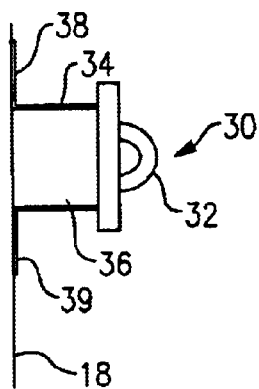
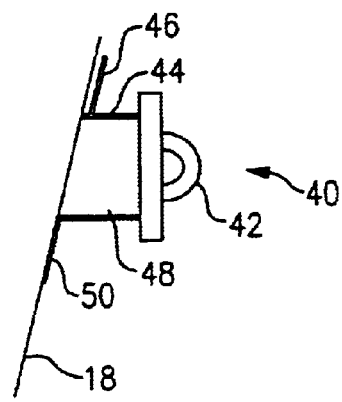
FIG.3 Prior Art
FIG.4
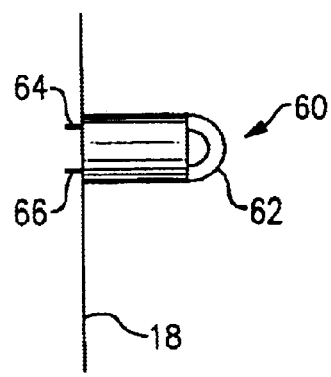
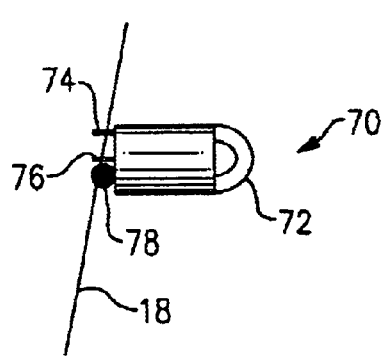
FIG.5 Prior Art
FIG.6

ILLUMINATED MESSAGE SIGN WITH ANGLED LIGHT EMITTING DEVICE ARRAY

FIELD OF THE INVENTION

The present invention relates to contrast enhanced portable message signs using LED arrays in a cabinet.

BACKGROUND OF THE INVENTION

Portable changeable light emitting diode ("LED") message signs, such as those manufactured by American Signal Company and by Precision Solar Controls, Inc., (e.g., their Solar Message Center 2000 product), are typically manufactured with a transparent front surface (commonly made of LEXAN® or other transparent or translucent material) that is tilted downwards in order to reduce the reflection from oncoming headlights bouncing back into the eyes of an automobile driver. In the conventional manufacturing process, the front of the sign is tilted down approximately 5 degrees while the back surface remains vertical thus causing the top surface to be wider than the bottom surface (see FIG. 1). The printed wiring boards are mounted parallel to the vertical back surface with the LED's mounted normal to the plane of the printed wiring boards, causing the center of the cone of light thus emitted to be aimed towards the horizon. Automatic equipment for installing LED's in printed wiring boards, such as a 6348 Radial Inserter available from Universal Instruments Corporation, is designed to only mount the LED's normal to the plane of the printed wiring board. LED's are mounted to the board either as through-mounts or surface-mounts.

The front and back surfaces being anti-parallel can cause problems in manufacturing; e.g., alignment of the angled portion with the array, spacing to prevent rattling, additional material may be required, and the like. Additionally, the front surface typically has a black screen printed on it with selected clear areas through which the LED illumination shines. With conventional tilted signs, the clear areas at the top of the sign must be larger in diameter than those at the bottom of the sign because at the top the front surface is farther away from the LED array than at the bottom. This can lead to inefficient presentation of the illumination array. Also, this can reduce the apparent half power angle of the LEDs in the array.

It would be desirable to have a contrast enhanced, more easily manufactured sign enclosure and mounting assembly that would present a downward tilted front surface to reduce headlight reflection yet maximize illumination power detectable by the oncoming driver. Such a product would enable the LED to be aimed at the horizon to provide the greatest illuminating power to the oncoming driver, yet have a downward tilted front surface to reduce headlight or sunlight reflection.

SUMMARY OF THE INVENTION

The present invention comprises a message sign having an angled front surface to reduce reflection of light from oncoming lights. The sign includes a printed circuit board having light emitting devices mounted thereto at an angle with respect to the board so that when the board is mounted in the sign and parallel to the front surface, the light emitting devices are angled generally parallel to the horizon so as to optimize the amount of light being emitted and visible to an oncoming driver. A number of variations of angling mechanisms and techniques are presented.

In one embodiment an LED is provided having two pins of different lengths. When the pins are mounted to or through the board, the pin length differential causes the LED to be angled with respect to the board.

In another embodiment, conventional through mount LED's are positioned in the board and a plate having apertures corresponding to the geometric layout of the LED's in the board is placed over the LED's. The plate can be moved parallel to the board causing the LED pins to bend and the LED's to be angled with respect to the board.

In a further embodiment, the board has a series of raised lines of epoxy or other material associated therewith so that when the LED's are positioned over the board, a portion of the LED is positioned over the raised line and the LED is thus tilted. Alternatively, the raised lines can be raised dots proximate to the place on the board where each LED is to be mounted. In another alternative embodiment, the dots can be positioned in different places with respect to the LED so that different LED's can be tilted at different angles. In this manner a "wide angle" light emitting device is created, thus increasing the viewing angle of light beyond currently available single LED half power angles.

In yet a further embodiment, surface mounted LED's are mounted on two different height surfaces associated with the board to provide an angled LED.

In still another embodiment, The LED's, either through mount or surface mount, could be mounted on narrow strips of printed circuit board material, for example one half inch wide by 12 inches long. The strips would then be mounted at an angle, for example of 5 degrees, to point towards the horizon.

Other features and advantages of the present invention will become apparent upon reading the following detailed description of embodiments of the invention, when taken in conjunction with the appended claims.

BRIEF DESCRIPTION OF THE DRAWINGS

The invention is illustrated in the drawings in which like reference characters designate the same or similar parts throughout the figures of which:

FIG. 1 is a side view of a conventional prior art message sign with a tilted front surface.

FIG. 2 is a side view of a message sign according to one embodiment of the present invention with a tilted set of components with the LED array being aimed at the horizon.

FIG. 3 is a side view of a conventional prior art surface mounted LED.

FIG. 4 is a side view of a surface mounted LED according to another embodiment of the present invention.

FIG. 5 is a side view of a conventional prior art through mounted LED.

FIG. 6 is a side view of a through mounted LED according to another embodiment of the present invention.

DETAILED DESCRIPTION OF THE EMBODIMENTS

Figure 7:
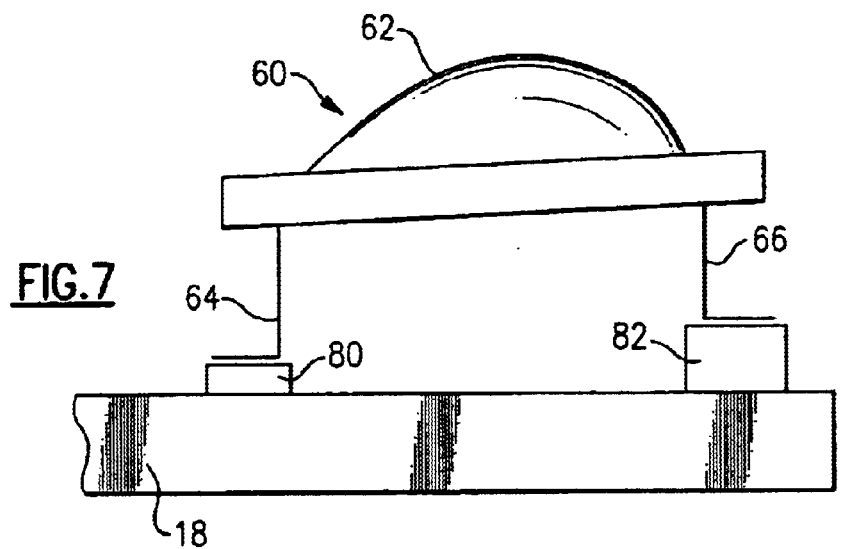
FIG. 7 is an elevational view of an LED and a modified printed circuit board according to another embodiment of the present invention.

FIG. 2 shows a portable message sign 5 according to a first embodiment of the present invention comprising a frame 10 having a cabinet 12 containing a back surface 14, front surface 16, and a printed circuit board 18. The sign 5 is attached to a support post 24, which can be mounted on a base 26, which may be movable. Alternatively, the post can be mounted to a stationary object, directly into the ground, or associated with a portable apparatus.

The front surface 16 can be made of a clear material, such as, but not limited to LEXAN® or other generally clear material capable of resisting wear and breakage as is known to those skilled in the art. The front surface 16 preferably has been printed with an opaque or semi-opaque layer to reduce reflection and enhance contrast. Portions of the printed layer are omitted to provide areas on the front surface which are clear, through which the LED can direct light. While conventional light emitting diodes are discussed in the present invention, it is to be understood that other light emitting devices are contemplated as being within the scope of the present invention, such as, but not limited to, liquid crystal elements, incandescent, fluorescent, laser, bioluminescent, combinations thereof, and the like.

Alternatively, the front surface 16 can be made of metal, such as, but not limited to, aluminum, steel or other stiff durable material. If made of an opaque material, the front surface 16 can be punched or die cut to provide the apertures for LED light transmission. With an opaque or translucent material a second layer of a thin transparent or translucent material is placed adjacent (and preferably mounted) to the front surface to provide a protective layer against water, dirt and other contaminants. The thin transparent layer can be coated with an ultraviolet light filter coated to absorb UV light which can cause damage to the acrylic LED lens.

The printed circuit board ("PCB") 18 is based upon a conventional arrangement. Where surface mount LED's are used they are affixed to the surface of the board 18. Where through mount LED's are used, the LED pins are inserted into holes arranged in an array on the board. The LED's are typically installed by automated machinery.

FIG. 3 shows a conventional prior art surface mounted LED 30 having a lens 32 and having a pair of pins 34, 36 with their distal ends 38, 39 bent back at about 90 degrees and mounted to a printed circuit board 18. FIG. 4 shows a surface mounted LED 40 of an embodiment of the present invention having a lens 42, a first pin 44 having a first end 46, and a second pin 48 having a second end 50. The first pin 44 is longer than the second pin 48. When surface mounted to a board 18 the first pin 44 and second pin 48 remain parallel to the horizontal while the board 18 is angled with respect to the vertical and the first leg 46 and second leg 50 are angled so as to be parallel to the board 18. A preferred angle is about 5 degrees, however, it is to be understood that any suitable angle can be chosen, within the limits of the hardware capabilities. When the LED 40 is mounted by conventional adhesive or solder to the board 18 and the board 18 is installed in the sign 5, the board is tilted and the LED 40 is aimed at the horizon. As a specific nonlimiting example, a surface mount LED 40 such as the PIRHANA™ series from Hewlett Packard is fabricated with two pairs of leads in a horizontally opposed manner so that when placed on a flat surface, the axis of the light emitted is normal to the surface. These leads can be fabricated so that one pair is longer than the other causing the axis of emission to be 5 degrees off of normal.

FIG. 5 shows a conventional prior art through mount LED 60 having a lens 62 and pins 64 and 66 which are mounted in a conventional manner in holes in the board 18. FIG. 6 shows a through mount LED 70 of another embodiment of the present invention having a lens 72 and pins 74 and 76 shown mounted in a board 18. A raised surface 78 is associated with the board 18 in such a way that the LED 70 is mounted partially over the raised surface 78 so as to be tilted when the pins 74 and 76 are soldered in place. The raised surface 78 can be made of epoxy or other adherable material. A radially mounted LED such as, but not limited to, model S4E38XX, manufactured by Toshiba Semiconductor, can be precisely mounted off axis using an aforementioned Radial Inserter by first screen printing a controlled stripe of thermally curable epoxy to one side of the leads. The epoxy can then be cured before the LED is inserted on top of it to give non malleable surface. The distance from the leads and thickness of the stripe effect the angle of tilt. The raised surface 78 can be wedge shaped and the LED 60 can be mounted on the wedge to cause the LED 60 to be angled with respect to the surface of the board 18.

Alternatively, the board 18 can be manufactured to have raised surfaces disposed in the desired array. The raised surface 78 can be screened onto the board. In one embodiment the raised surface 78 is a bead of epoxy deposited in a line across the array of LED holes in the board 18. With conventional automated PCB construction and assembly technology it is possible to accurately form the bead to the desired width and height so as to control the tilt of the LED to a fine degree. When the LED 70 is placed over the appropriate pin holes by a robotic gripper, a vertical pusher pushes the LED 70 pins 74 and 76 into the holes in the board. The raised surface 78 will cause one side of the LED 70 to be spaced away from the board 18, thereby creating a controllable tilt to the LED 70. It also is possible to use two raised surfaces 78 disposed in a similar manner to tilt the LED 70 in the desired direction and simultaneously raise the LED 70 above the surface of the board in order to improve soldering by allowing gases to escape from under the LED 70.

Alternatively, as shown in FIG. 7, a board 18 can be made having a first raised surface 80 and a second raised surface 82, whereby the first raised surface 80 is lower in height than the second raised surface 82. The surfaces can be constructed of any suitable material, such as, but not limited to, copper. When a conventional surface mount LED 60, having a lens 62 and pins 64 and 66 (both having the same length), is mounted on the surfaces 80 and 82, the differential heights cause the pins 64 and 66 to be offset, thereby causing the LED 60 to be tilted with respect to the plane of the board 18. The tilt angle can be accurately determined by the relative height differential of the raised surfaces 80 and 82.

Figure 8:
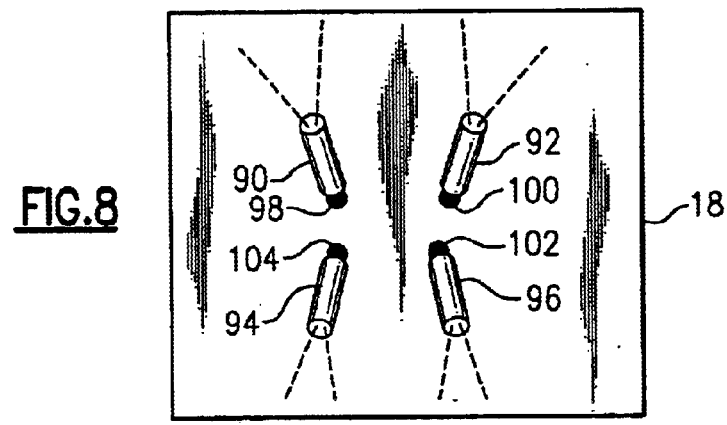
FIG. 8 is a top view of an LED array where the LED's are tilted outward and away from each other.

The raised surface 78 can be a single strip for each row of the LED array or can be a small strip or dot for each LED that is laid or screened on to the board 18. It is also contemplated as within the scope of the present invention to design a board 18 having raised surfaces 78 of different heights or in different positions to create different tilt angles or an LED array with the individual LED's being tilted toward or away one another. For example, as shown in the top view of FIG. 8, an array of four LED's 90, 92, 94 and 96, each LED being tilted away from the other three LED's by the presence of a raised surface 98, 100, 102 and 104, positioned under a different "corner" of each LED. Accordingly, the ray trace of each LED (shown in dashed lines emanating from each LED lens) would angle outward slightly. This would enable the four LED array to have a wider angle and half power angle. One can appreciate that any array of two or more LED's can be arranged at different tilt angles with respect to one another. In a portable message sign, arrays of four, eight, nine and twelve may be the most convenient to form a subarray within a larger array, with each subarray having a wide angle illumination pattern, thereby enabling the sign to be read at a greater angle from the perpendicular. This can be a significant advantage for signs that are encountered on roads going around a curve, where an oncoming vehicle and driver must be able to see the sign at angles offset from straight on to perceive the message. This is also advantageous where drivers from several different approach angles must be able to see the same sign, but will not necessarily be viewing the sign straight on. Such wide angle subarrays can reduce the need for wide angle lenses that otherwise would have to be placed over the subarray of nontilted LED's to create the wide angle effect.

Figure 8A:
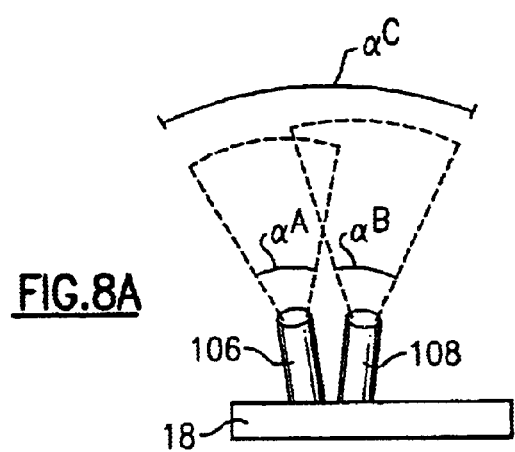
FIG. 8A is a side view of an LED array of FIG. 8 showing the half power angle illumination spread pattern as shown in dashed lines.

It is possible to use at least two LED's having large half power angles and placing them adjacent to one another, each being tilted away from the other slightly so that the half power angles are substantially additive, thereby providing an LED array with a greater half power angle than either of the LED's alone. FIG. 8A shows a board 18 having an LED 106 and an LED 108 mounted on the board 18 at slight angles away from each other. LED 106 has a half power angle $\alpha^A$ and LED has a half power angle $\alpha^B$. The mounted array of both LED's creates a combined half power angle of $\alpha^A + \alpha^B = \alpha^C$ where $\alpha^C$ is the effective half power angle of the array. Where current LED's have an approximate high end half power angle of about 60 degrees, the array of the present invention can provide an effective half power angle of 120 degrees or more. It is also possible to add a third LED to the two LED array shown in FIG. 8A to add additional illumination power to the central portion of the angle nearest the perpendicular to the board 18. Such a wide angle can provide substantial improvements to contrast enhancement at larger angles from the perpendicular than previously achievable, thereby making a more versatile sign.

The LED's of this wide angle array can be tilted on the board by any of the embodiments described herein.

Figure 9:
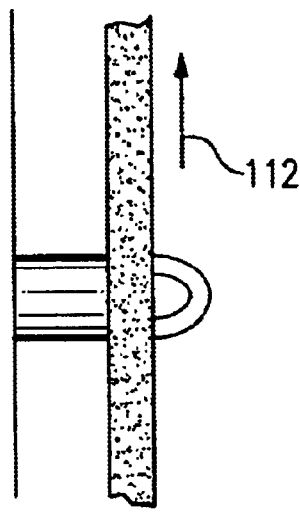
FIG. 9 shows a through mounted LED with a positioning plate placed thereon.

FIG. 9 shows another embodiment of the present invention in which a through mounted LED 60 is shown with the pins 64 and 66 passing through the board 18. The LED's can be inserted into a printed wiring board and a perforated plate placed on top of and around the body of the LED. The plate is then moved in the proper direction to skew the LED's the desired 5 degrees and affixed. The resulting assembly is then soldered to connect the LED's. After soldering, the plate can remain affixed to the printed wiring board or an alternate method such as conformal coating, effectively gluing the part in place can be employed to maintain the orientation of the LED's.

Figure 10:
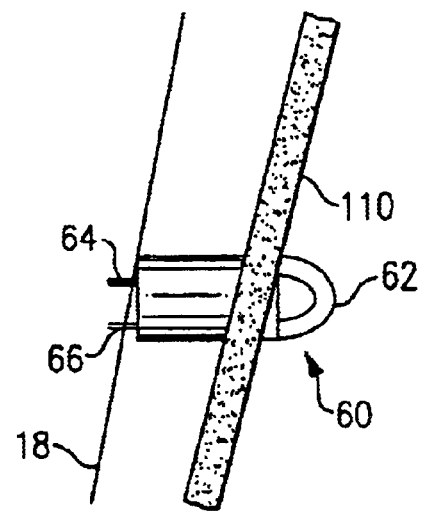
FIG. 10 shows the LED and positioning plate of FIG. 9 after the plate has been moved, causing the LED to tilt.

A positioning plate 110 has an array of apertures sized and arranged to correspond to the array of LED's 60. The plate 110 is placed over the array of mounted LED's 60 is a spaced apart and parallel relationship to the board 18 and the plate 110 is moved parallel with respect to the board 18, shown in FIG. 9 by the arrow 112. This sheering movement causes the pins 64 and 66 to pull out of the board slightly and cause the LED 60 to tilt with respect to the board 18, as shown in FIG. 10. The pins 64 and 66 will maintain their position after the plate 110 is removed and the pins then soldered, glued, conformal coated or otherwise fixed in place. Alternatively, the plate can be left in place, thereby creating the desired tilted LED array 60.

Alternatively, the plate 110 can have its apertures created so as to be slightly offset from the center of each LED 60 lens 62. The plate 110 is forced over the LED 60 array and, in doing so, causes the pins 64 and 66 to bend slightly.

Figure 11:
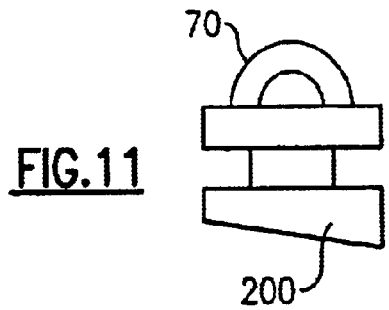
FIG. 11 is a schematic side view of a further alternative embodiment of the present invention in which a plurality of LEDs are mounted to a wedge shaped strip of PCB material.
Figure 12:
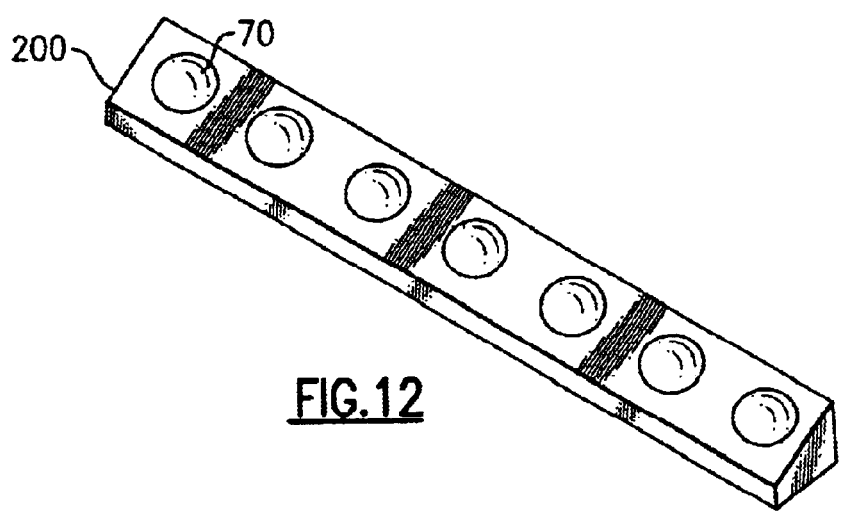
FIG. 12 is a schematic perspective view of the further alternative embodiment of FIG. 11.

In a further alternative embodiment of the present invention, shown in FIGS. 11 and 12, the LEDs 70, either through mount or surface mount, can be mounted on a narrow strip 200 of printed circuit board material, for example, but not by way of limitation, a strip about one half inch wide and twelve inches long. The strip of material 200 can be wedge-shaped. The strips 200 can be mounted to the PCB to present the LEDs 70 an angle pointing toward the horizon.

Figure 13:
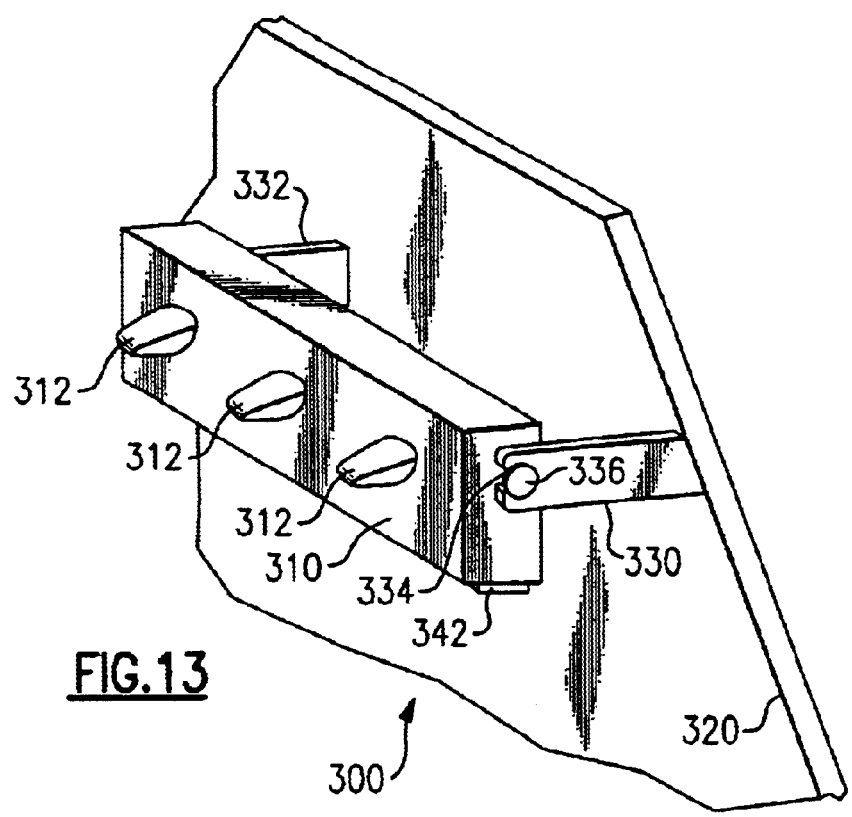
FIG. 13 is a schematic perspective view of an additional embodiment of the present invention.

In yet a further alternative embodiment of the present invention, shown in FIG. 13, an LED aiming apparatus 300 comprising an array 310 of LED's 312 is pivotably mounted at either end to the PCB 320 by a pair of pivot arms 330, 332. The array 310 can have an annular boss 334 extending from each end to which an arm 330 can attach, such as by a notch 336 in the arm 330. The boss 334 and arm 330 can be in electrical communication with the PCB 320 to power the LEDs 312. Alternatively, a wire 340 (not shown) can electrically communicate the array 310 and the PCB 320. The apparatus 300 can pivot with respect to the angled PCB 320 when the PCB 320 is angled with respect to the horizon. It is contemplated that a plurality of arrays 300 can be pivotably mounted in rows or other geometries to the PCB 320 to create the visual sign. The boss 334 at each end of the array 310 is preferably mounted or formed to be above the midpoint of the array so that the array 310 is bottom heavy and will orient itself by gravity so that the LEDs 312 point horizontally. Alternatively, the bottom of the array 310 can be artificially weighted by either a separately mounted weight strip of material 342 or integrally formed in the array 310.

Figure 14:
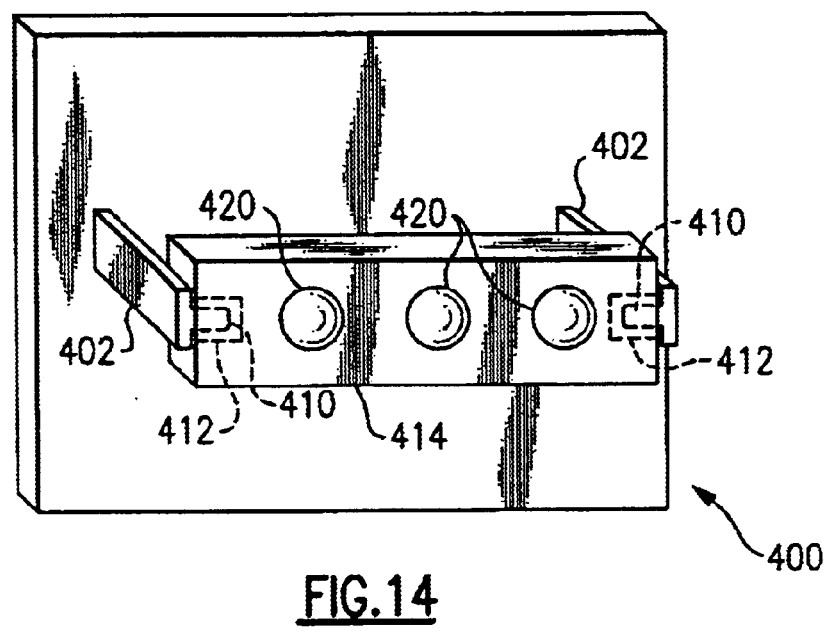
FIG. 14 is a schematic perspective view of an additional embodiment of the present invention as a variation of the embodiment shown in FIG. 13.

In a variation of the apparatus 300, shown in FIG. 14, an apparatus 400 has an arm 402 having a protrusion 410, rather than a notch. The protrusion 410 can be inserted within a recess 412 in an array 414 so that the array 414 can pivot and maintain the LEDs 420 in a horizontal position. Other mechanisms of achieving a pivoting ability of the array are contemplated as being within the scope of the present invention.

An advantage of a pivoting or floating LED array is that the LEDs will be aimed toward the horizon regardless of what angle the PCB or the sign is adjusted to be. Thus, installation and aiming can be simplified because horizontal aiming is automatically achieve by the gravity pivoting of the arrays without requiring precise adjustment to the angle of the PCB.

Although only a few exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention as defined in the following claims. It should further be noted that any patents, applications and publications referred to herein are incorporated by reference in their entirety.

What is claimed is:

1. A message sign, comprising:
   a) a rear surface;
   b) a front surface;
   c) a printed circuit board (PCB) generally parallel to said front surface;
   d) at least one light emitting device associated with said printed circuit board wherein said light emitting device has at least two pins for mounting to or through said PCB; and,
   e) means associated with said at least one light emitting device for positioning said at least one light emitting device at an angle with respect to said printed circuit board, said positioning means comprising at least one raised surface of a portion of said PCB over which at least a portion of said light emitting device is positioned such that said raised surface, wherein said raised surface is an epoxy adhesive deposited on said PCB in a stripe across a given length of said PCB.

2. The message sign of claim 1, wherein said at least one light emitting device comprises a plurality of light emitting devices, each device having a pair of pins extending therefrom, said PCB having a plurality of spaced apart apertures defined therein arranged in pairs of apertures such that each pair of said apertures can receive said pair of pins, said at least one dot comprising a dot for each pair of apertures, said dot being located at a predetermined location with respect to said pair of apertures such that when said pins of said light emitting device are inserted into said pair of apertures, said dot causes said light emitting device to be angled with respect to said PCB, and said dot causing said angle to be different depending where said dot is located with respect to said pair of apertures, such that two adjacent light emitting diodes are angled differently with respect to each other.

3. A message sign, comprising:
   a) a rear surface;
   b) a front surface;
   c) a printed circuit board (PCB) generally parallel to said front surface;
   d) at least one light emitting device associated with said printed circuit board, said light emitting device has at least two pins for mounting to or through said PCB; and,
   e) means associated with said at least one light emitting device for positioning said at least one light emitting device at an angle with respect to said printed circuit board, said positioning means comprising at least one raised surface of a portion of said PCB over which at least a portion of said light emitting device is positioned such that said raised surface, wherein said raised surface is an epoxy adhesive deposited on said PCB in at least one dot proximate to at least one opening defined in said PCB through which pins of said light emitting device can be inserted such that said light emitting device is maintained at an angle with respect to said PCB.

4. The message sign of claim 3, wherein at least two adjacent said light emitting devices each have a half power angle that partially overlap such that the combined half power angle is greater than the individual half power angles.

5. A message sign, comprising:
   a) a rear surface;
   b) a front surface;
   c) a printed circuit board (PCB) generally parallel to said front surface;
   d) at least one light emitting device associated with said printed circuit board, said light emitting device having at least two pins for mounting to or through said PCB; and,
   e) means associated with said at least one light emitting device for positioning said at least one light emitting device at an angle with respect to said printed circuit board, wherein said positioning means comprising at least one raised surface of a portion of said PCB over which at least a portion of said light emitting device is positioned such that said raised surface, and wherein said at least one raised surface comprises two generally parallel stripes associated with said PCB, one of said stripes being higher that the other said stripe, said light emitting device being mounted on said two stripes such that said light emitting device is angled with respect to said PCB.

* * * * *